United States Patent
Motonishi

(10) Patent No.: US 7,672,082 B2
(45) Date of Patent: Mar. 2, 2010

(54) FLEXIBLE WIRING BOARD FOR MAGNETIC HEAD ASSEMBLY

(75) Inventor: Michiharu Motonishi, Niigata-ken (JP)

(73) Assignee: TDK Corporation, Tokyo (JP)

(*) Notice: Subject to any disclaimer, the term of this patent is extended or adjusted under 35 U.S.C. 154(b) by 761 days.

(21) Appl. No.: 11/505,761

(22) Filed: Aug. 16, 2006

(65) Prior Publication Data

US 2007/0047149 A1    Mar. 1, 2007

(30) Foreign Application Priority Data

Aug. 31, 2005    (JP) .............................. 2005-252118

(51) Int. Cl.
G11B 5/60    (2006.01)
G11B 21/21   (2006.01)

(52) U.S. Cl. ................. 360/245.9; 360/264.2

(58) Field of Classification Search ............. 360/245.9, 360/264.2, 266.3; 174/254, 250, 255, 268; 439/67, 77, 493

See application file for complete search history.

(56) References Cited

U.S. PATENT DOCUMENTS

| | | | |
|---|---|---|---|
| 5,446,240 A * | 8/1995 | Hayakawa et al. | ............. 174/69 |
| 5,917,149 A * | 6/1999 | Barcley et al. | ............... 174/378 |
| 6,631,052 B1 * | 10/2003 | Girard et al. | ............. 360/245.8 |
| 7,489,479 B2 * | 2/2009 | Arya et al. | ................ 360/245.9 |
| 2002/0181156 A1 * | 12/2002 | Shiraishi et al. | ........... 360/245.9 |
| 2004/0228038 A1 | 11/2004 | Nakamura et al. | |
| 2005/0018409 A1 * | 1/2005 | Hirakata | ...................... 361/752 |

FOREIGN PATENT DOCUMENTS

| | | | | |
|---|---|---|---|---|
| JP | 03101184 | A | * | 4/1991 |
| JP | 04111217 | A | * | 4/1992 |
| JP | 05182527 | A | * | 7/1993 |
| JP | 5-218597 | | | 8/1993 |
| JP | 8-130352 | | | 5/1996 |
| JP | 2000-048339 | | | 2/2000 |
| JP | 2000-331323 | | | 11/2000 |
| JP | 2001-111178 | | | 4/2001 |
| JP | 2001111178 | A | * | 4/2001 |
| JP | 2003069165 | A | * | 3/2003 |
| JP | 2004-103173 | | | 4/2004 |
| JP | 2004247342 | A | * | 9/2004 |
| JP | 2004-335042 | | | 11/2004 |

OTHER PUBLICATIONS

Office Action issued in corresponding Japanese Patent Application No. 2005-252118, mailed on Nov. 13, 2007.
English translation for Office Action for corresponding Chinese Patent Application Serial No. 2006101266578, dated Nov. 23, 2007.

* cited by examiner

*Primary Examiner*—William J Klimowicz
(74) *Attorney, Agent, or Firm*—Brinks Hofer Gilson & Lione

(57) ABSTRACT

A flexible wiring board for a magnetic head assembly is provided. The flexible wiring board includes a wiring pattern connected to a head body at one end and to an external circuit system at the other end, an insulation protection film that protects the wiring pattern, and a base composed of a metal that extends over the insulation protection film and the wiring pattern. The base has a guide through hole that functions as a guide for bending the base. The guide through hole has a plurality of notches disposed at different positions in a length direction of the base. The notches reduce a remaining width of the base in a bend width direction of the base.

12 Claims, 6 Drawing Sheets

FLEXIBLE WIRING BOARD FOR MAGNETIC HEAD ASSEMBLY

This application claims the benefit of Japanese Patent Application No. 2005-252118 filed on Aug. 31, 2005 which is hereby incorporated by reference.

BACKGROUND

1. Field

A flexible wiring board for a magnetic head assembly is provided.

2. Related Art

A typical magnetic head assembly comprises a flexible wiring board for conductively connecting a head body (magnetic head slider) fixed to a free end of the magnetic head assembly to a circuit system provided outside the head assembly. The flexible wiring board generally includes a wiring pattern having one end connected to the head body and the other end connected to the external circuit system, an insulation protection film for protecting the wiring pattern, and a metal base material provided over the insulation protection film and the wiring pattern. The flexible wiring board is fixed to the magnetic head assembly such that an intermediate portion of the flexible wiring board in the longitudinal direction thereof is bent perpendicularly. Examples of such a flexible wiring board are disclosed in Japanese Unexamined Patent Application Publication Nos. 2000-48339, 2000-331323, 2001-111178, and 2004-335042 (U.S. Patent Application Publication No. 2004/0228038A1).

In known structures, when the flexible wiring board is bent perpendicularly, a bending stress is concentrated at a part of the bent portion and there is a risk that cracks will form in the insulation protection film. The insulation protection film is composed of insulating resin material, such as polyimide, and the risk that cracks will form is increased as the mechanical strength of the insulation protection film is increased in order to ensure the protection of the wiring pattern. Cracks in the bent portion can be prevented by reducing the concentration of bending stress in the flexible wiring board.

SUMMARY

A flexible wiring board for a magnetic head assembly includes a wiring pattern connected to a head body at one end and to a circuit system provided outside the magnetic head assembly at the other end. The head body is fixed to a free end of the magnetic head assembly. An insulation protection film protects the wiring pattern. A base composed of a metal extends over the insulation protection film and the wiring pattern. The base having a guide through hole that functions as a guide for bending the base. The guide through hole has a plurality of notches disposed at different positions in a length direction of the base. The notches locally reducing a remaining width of the base in a bend width direction of the base.

In the above-described structure, when a bending stress is applied to the flexible wiring board, the flexible wiring board is bent stepwise due to the notches. Therefore, the bending stress does not concentrate locally and formation of cracks in the insulation protection film can be prevented.

The base may be bent using the notches such that the wiring pattern and the insulation protection film face inward.

The notches may include cutouts whose width is reduced in a direction from the inner periphery of the guide through hole toward the outer periphery of the base. Alternatively, the notches may include cutouts whose width is reduced in a direction from the outer periphery of the base toward the inner periphery of the guide through hole. In another embodiment, the notches may include cutouts whose width is reduced in a direction from the inner periphery of the guide through hole toward the outer periphery of the base and cutouts whose width is reduced in a direction from the outer periphery of the base toward the inner periphery of the guide through hole.

Preferably, each of the notches is axisymmetric about a centerline of the notch in the length direction of the base. When each notch is axisymmetric, the center position of each notch serves as a bending reference and the flexible wiring board can be more stably bent at the positions where the notches are provided.

The cutouts are formed in pairs such that the cutouts of each pair face each other in the bend width direction of the base. When the notches of each pair are arranged so as to face each other in the bend width direction, the flexible wiring board can be easily bent at the positions where the notches are provided.

The guide through hole extends beyond the outermost notches in the length direction of the base. In such a structure, since the insulation protection film is not adhered to the base in the guide through hole, the insulation protection film can be easily bent. Therefore, the formation of cracks can be more reliably prevented.

The base may be composed of stainless steel and the insulation protection film may be composed of polyimide.

Thus, a flexible wiring board for a magnetic head assembly that prevents the formation of cracks in the bent portion and increases reliability is obtained.

DESCRIPTION OF THE PREFERRED EMBODIMENTS

Figure 1:
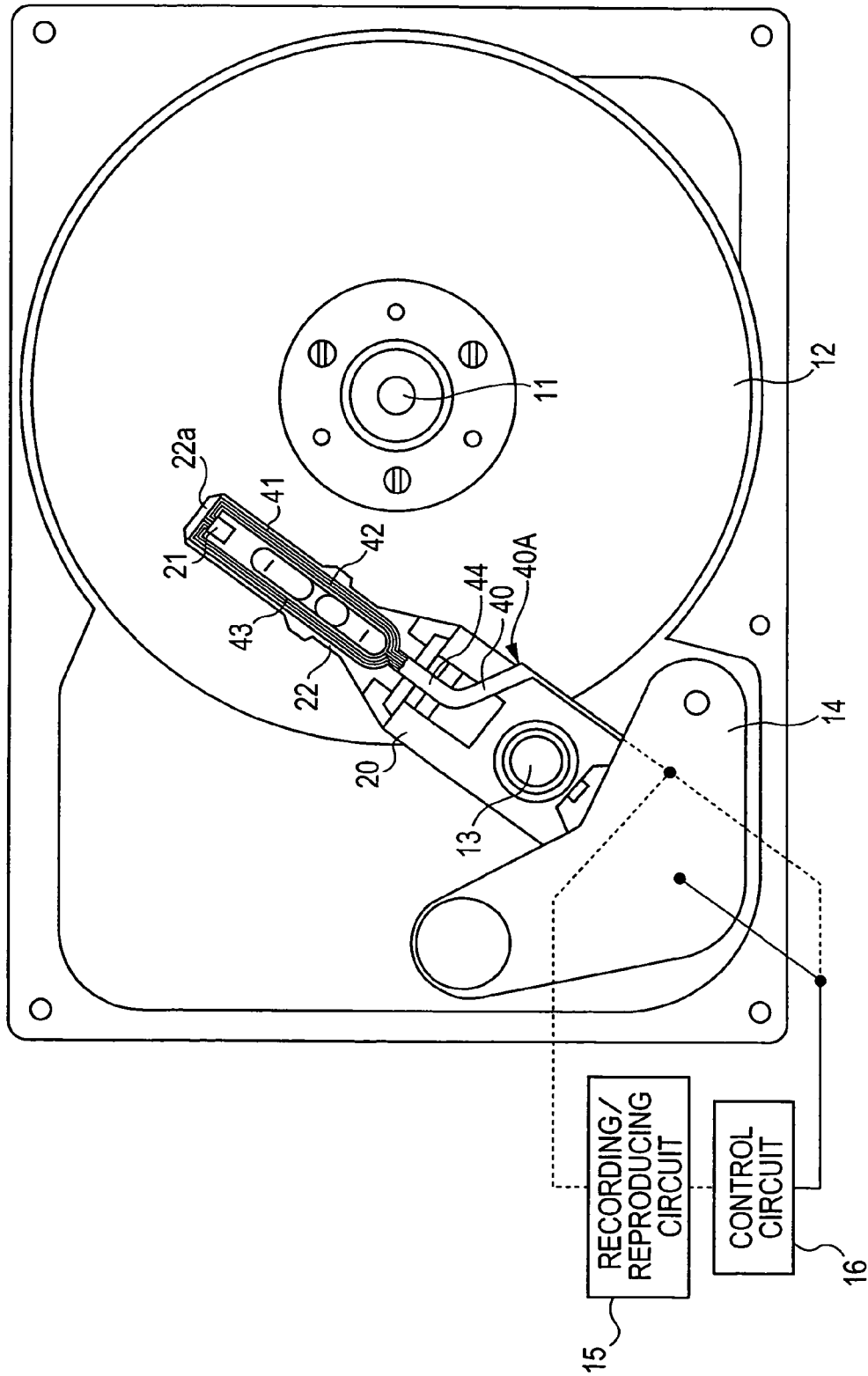
FIG. 1 is a plan view that illustrates the overall structure of a hard disk device including a flexible wiring board of a magnetic head assembly according to a preferred embodiment.

The overall structure of a hard disk device including a flexible wiring board for a magnetic head assembly according to the preferred embodiments will be described below with reference to FIGS. 1 and 2.

A hard disk (magnetic disc) 12 can be rotated around a rotating shaft 11, and a base portion of a swing arm 20 is supported in a region outside the hard disk 12 such that the swing arm 20 can pivot in mutually opposite directions about the center of a rotating shaft 13. The swing arm 20 includes a flexure 22 and a load beam 23 (FIG. 2). The flexure 22 is a thin, flexible metal plate that is shaped like a leaf spring. The flexure 22 has a free end portion 22a to which a head body (magnetic head slider) 21 is adhered, and is mounted on the load beam 23 at an end thereof such that the flexure 22 elastically retains the head body 21 above the load beam 23. When the swing arm 20 is pivoted back and forth about the rotating shaft 13 by an actuator 14, the head body 21 reciprocates in a substantially radial direction with respect to the hard disk 12.

A flexible wiring board 40 is adhered to a surface of the flexure 22 with resin adhesive or the like. The flexible wiring board 40 includes a base 41 composed of stainless steel, a plurality of wiring patterns 42 formed on the base 41, an insulation protection film 43 that covers and protects the wiring patterns 42, and a cover film 44 that covers a surface of the insulation protection film 43. The wiring patterns 42 are formed of a thin film composed of conductive material, for example, Cu and W, and are each connected to the head body 21 at one end and to an external circuit system (a recording/reproducing circuit 15 and a control circuit 16) at the other end. The wiring patterns 42 are each bonded to the head body 21 at one end thereof using gold balls. The insulation protection film 43 is composed of insulating resin material, for example, polyimide, and the cover film 44 is composed of, for example, polyimide. The thickness of the base 41 is in the range of about 15 μm to 25 μm, the thickness of the wiring patterns 42 is in the range of about 18 μm or less, and the thickness of the insulation protection film 43 and the cover film 44 is in the range of about 10 μm to 40 μm.

Figure 2:
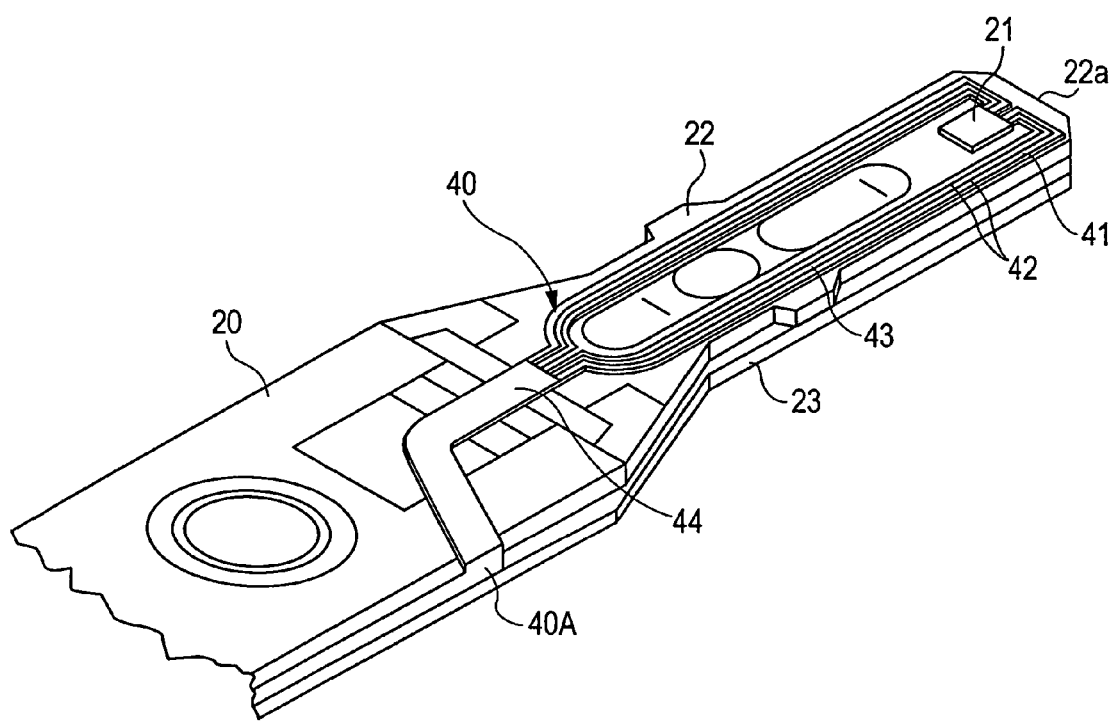
FIG. 2 is a perspective view of a free end portion of the magnetic head assembly shown in FIG. 1.

Referring to an enlarged view shown in FIG. 2, the flexible wiring board 40 includes portions that extend along the sides of the flexure 22 from the free end portion 22a of the flexure 22 and that are combined together at the rear end of the flexure 22. The flexible wiring board 40 is fixed such that the flexible wiring board 40 is bent perpendicularly onto a side face of the swing arm 20. A bend portion 40A of the flexible wiring board 40 has a rectangular guide through hole 50 (see FIG. 3) that extends in the length direction of the base 41 and that is formed by cutting the base 41. The guide through hole 50 functions as a bending guide when the flexible wiring board 40 is bent, and partially reduces the mechanical strength of the base 41 so that the flexible wiring board 40 can be easily bent. A part of the back surface of the insulation protection film 43 is exposed through the guide through hole 50.

The control circuit 16 functions as control that controls the overall operation of the hard disk device. The control circuit 16 controls transmission/reception of recording/reproducing information signals between the head body 21 and the recording/reproducing circuit 15. The control circuit 16 drives and controls the actuator 14 on the basis of tracking signals obtained from the hard disk 12 by the head body 21 so as to position the swing arm 20 and the head body 21 at a correct tracking position.

The bend portion 40A of the flexible wiring board according to the present embodiment will be described with reference to FIGS. 2 and 3. FIG. 2 is an enlarged perspective view that illustrates the flexible wiring board 40, and FIG. 3 is a plan view that illustrates the guide through hole 50 and notches 51 formed in the bend portion 40A of the flexible wiring board 40 in the state before being bent.

In the bend portion 40A of the flexible wiring board 40, the guide through hole 50 that functions as a guide that bends the flexible wiring board 40 is formed in the base 41. The guide through hole 50 has a plurality of notches 51 that locally reduce the remaining width W of the base 41 in a bend width direction thereof (vertical direction in FIG. 3) and that define bending references.

Figure 3:
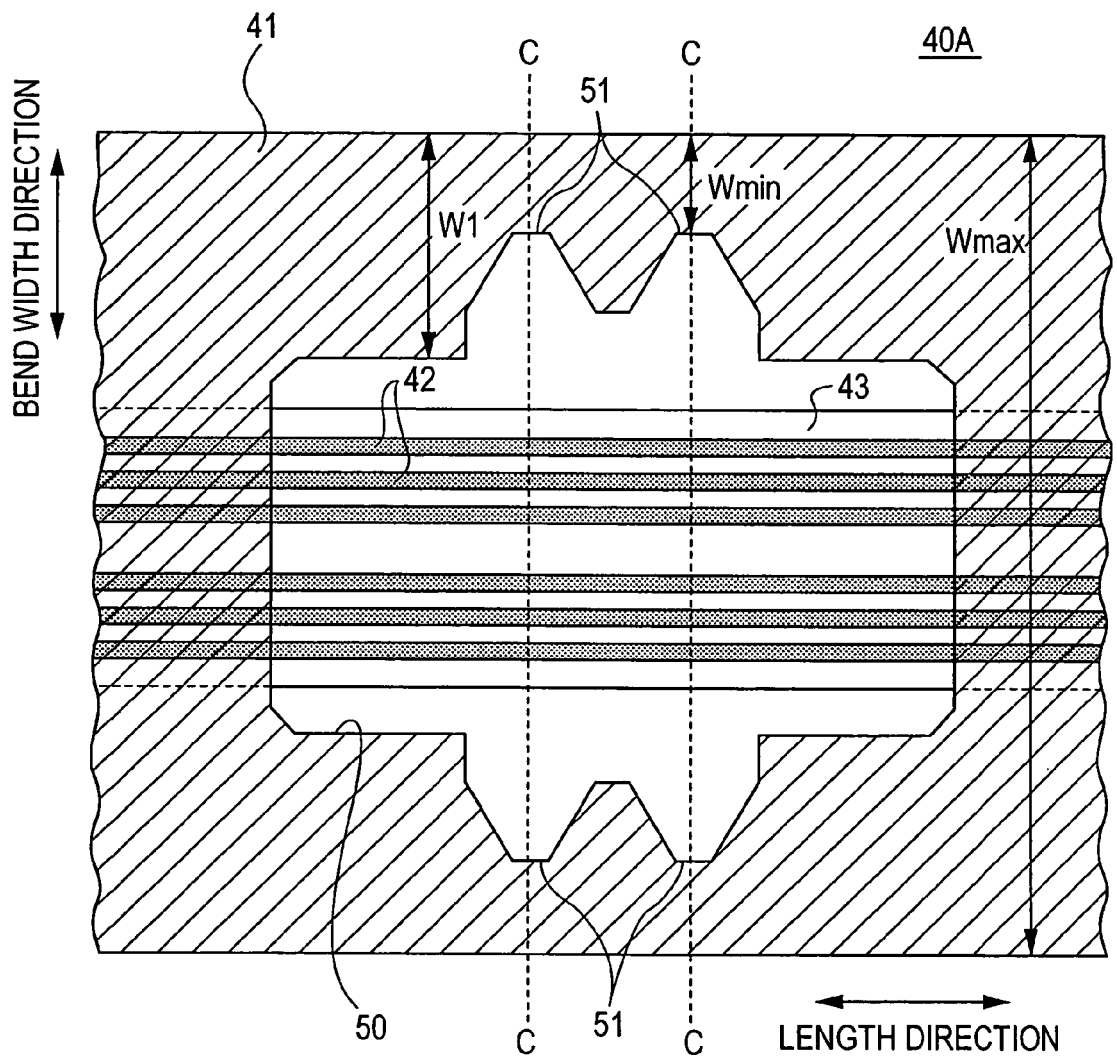
FIG. 3 is an enlarged plan view that illustrates a bend portion of the flexible wiring board shown in FIG. 2.

The notches 51 face one another in the bend width direction across the guide through hole 50 so as to form pairs located at different positions along the length direction of the base 41 (horizontal direction in FIG. 3). Each of the notches 51 is a V-shaped cutout formed in the inner periphery of the guide through hole 50 so as to point toward the outer edge of the base 41, and has a symmetrical shape about an imaginary bending line C shown by a dashed line in FIG. 3. The width of each notch 51 is reduced to a minimum at the center of the notch 51 in the length direction of the base 41 (horizontal direction in FIG. 3). Each of the lines passing through the centers of two notches 51 that face each other in the bend width direction defines the bending reference line C.

In the bend portion 40A of the flexible wiring board 40, the remaining width of the base 41 in the bend width direction is a minimum width Wmin at the center of each notch 51, and is a maximum width Wmax in a region where neither the guide through hole 50 nor the notches 51 are formed. The maximum width Wmax is equal to the width of the base 41. The remaining width W1 of the base 41 in a region where the guide through hole 50 is formed but the notches 51 are not provided satisfies Wmin<W1<Wmax. As the remaining width is reduced, the mechanical strength of the base 41 is reduced and the base 41 is easily bent. Therefore, when a bending stress is applied to the bend portion 40A of the flexible wiring board 40, the bend portion 40A can be easily bent along the lines (bending reference lines C) that pass through the centers of the notches 51 that face each other in the bend width direction. The curvature of the bend portion 40A is determined by the shape of an outer edge of each notch 51.

Since the guide through hole 50 and the notches 51 are formed in the base 41, a portion of the insulation protection film 43 is not adhered to the base 41 and is easily bent in the bend portion 40A. The guide through hole 50 extends in the length direction of the base 41 beyond the outermost notches 51. When the guide through hole 50 extends in the length direction of the base 41 in this manner, the area of the portion of the insulation protection film 43 that is not adhered to the base 41 is increased. Therefore, bendability of the insulation protection film 43 can be further increased.

Figure 4A:
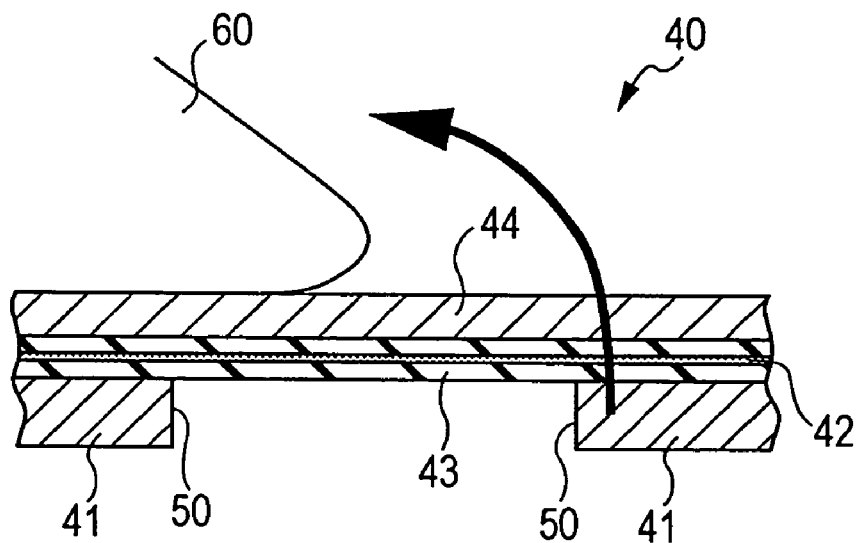
FIGS. 4A and 4B are sectional views that illustrate steps of bending the flexible wiring board.
Figure 4B:
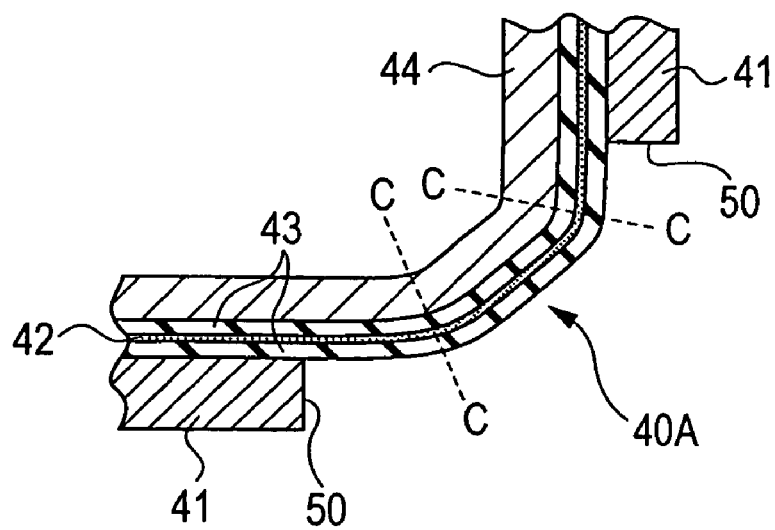

The flexible wiring board 40 having the above-described structure is bent perpendicularly such that the cover film 44 faces inward (valley fold when viewed from the insulation protection film 43) in the steps shown in FIGS. 4A, and 4B.

As shown in FIG. 4A, the flexible wiring board 40 is placed such that the base 41 faces downward, and a portion of the flexible wiring board 40 near one end of the guide through hole 50 is fixed by placing a pressing member 60 on a front surface of the cover film 44.

As shown in FIG. 4A, a portion of the flexible wiring board 40 near the other end of the guide through hole 50 (for example, a portion that is not fixed by the pressing member 60) is lifted upward (in the direction shown by the arrow). A bending stress is applied to the flexible wiring board 40 in a region between one end and the other end of the guide through hole 50. As shown in FIG. 4B, the base 41 of the flexible wiring board 40 is bent stepwise at the centers of the notches (positions shown by the bending reference lines C in FIG. 3). As a result, the bend portion 40A is bent such that a portion at one end of the guide through hole 50 and a portion at the other end of the guide through hole 50 extend perpendicularly with respect to each other. The bend portion 40A is obtained by raising a portion of the flexible wiring board 40 a single time. According to the present embodiment, two pairs of notches 51 are provided at two positions of the guide through hole 50. Therefore, the bend portion 40A of the flexible wiring board 40 is bent in two steps, each pair of notches 51 providing a bending angle of about 45°.

As described above, in the present embodiment, the notches 51 are provided for locally reducing the remaining width of the base 41 in the bend width direction and defining the bending references for the flexible wiring board 40. Therefore, the flexible wiring board 40 can be bent stepwise due to the notches 51. When the flexible wiring board 40 is bent stepwise as described above, the bending stress applied to the flexible wiring board 40 (the base 41, the wiring patterns 42, the insulation protection film 43, and the cover film 44) can be dispersed. Therefore, expansion of the insulation protection film 43 can be reduced and formation of cracks can be prevented. According to the present embodiment, since the guide through hole 50 extends beyond the outermost notches 51 in the length direction of the base 41, bendability of the insulation protection film 43 is increased. This also helps to prevent the formation of cracks. The high-reliability flexible wiring board 40 that prevents formation of cracks is obtained. In addition, the mechanical strength of the insulation protection film 43 can be increased.

According to the present embodiment, the notches 51 are formed integrally with the guide through hole 50. The notches 51 may also be formed separately from the guide through hole 50, and various modifications are possible.

Figure 5:
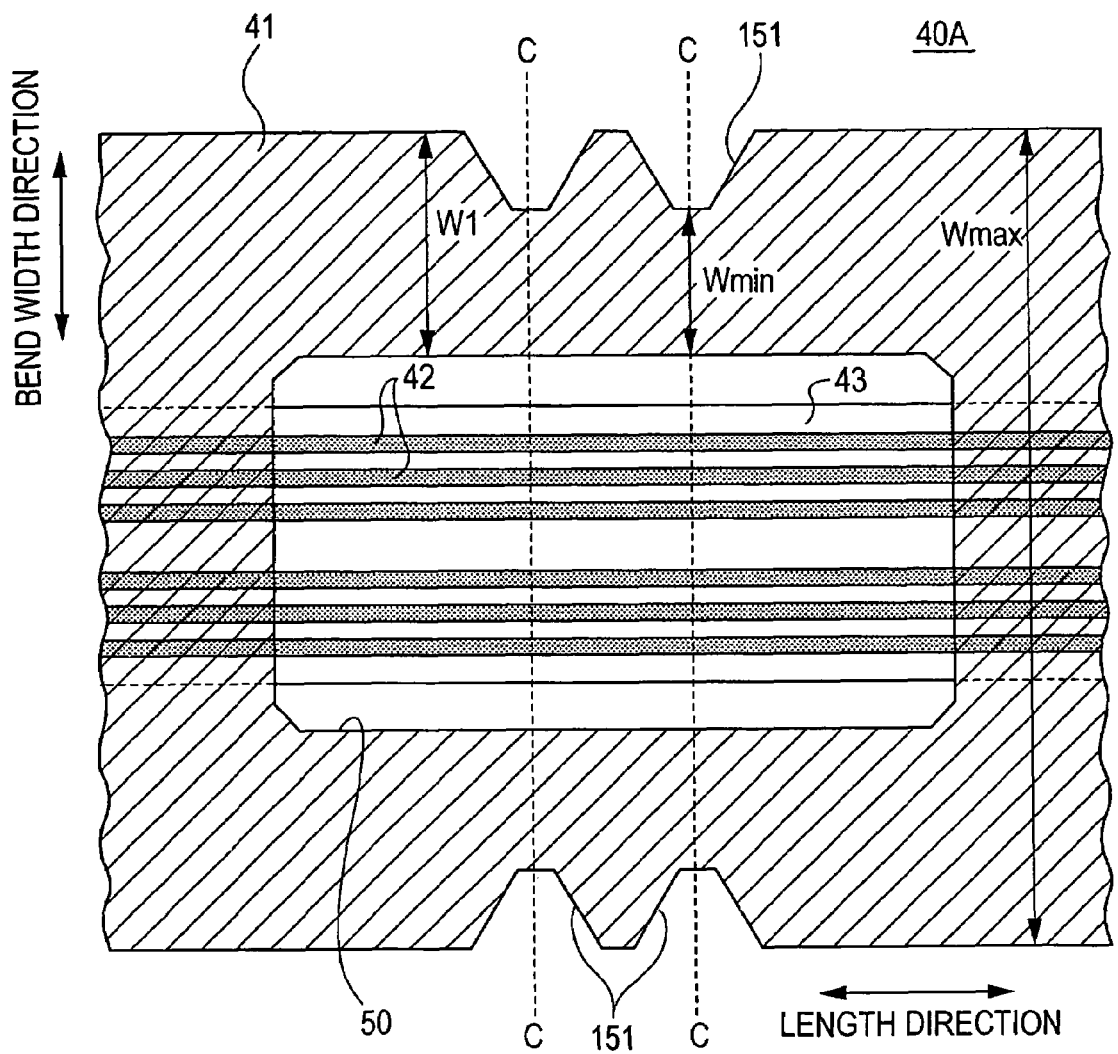
FIG. 5 is a plan view of notches according to a first preferred embodiment.
Figure 6:
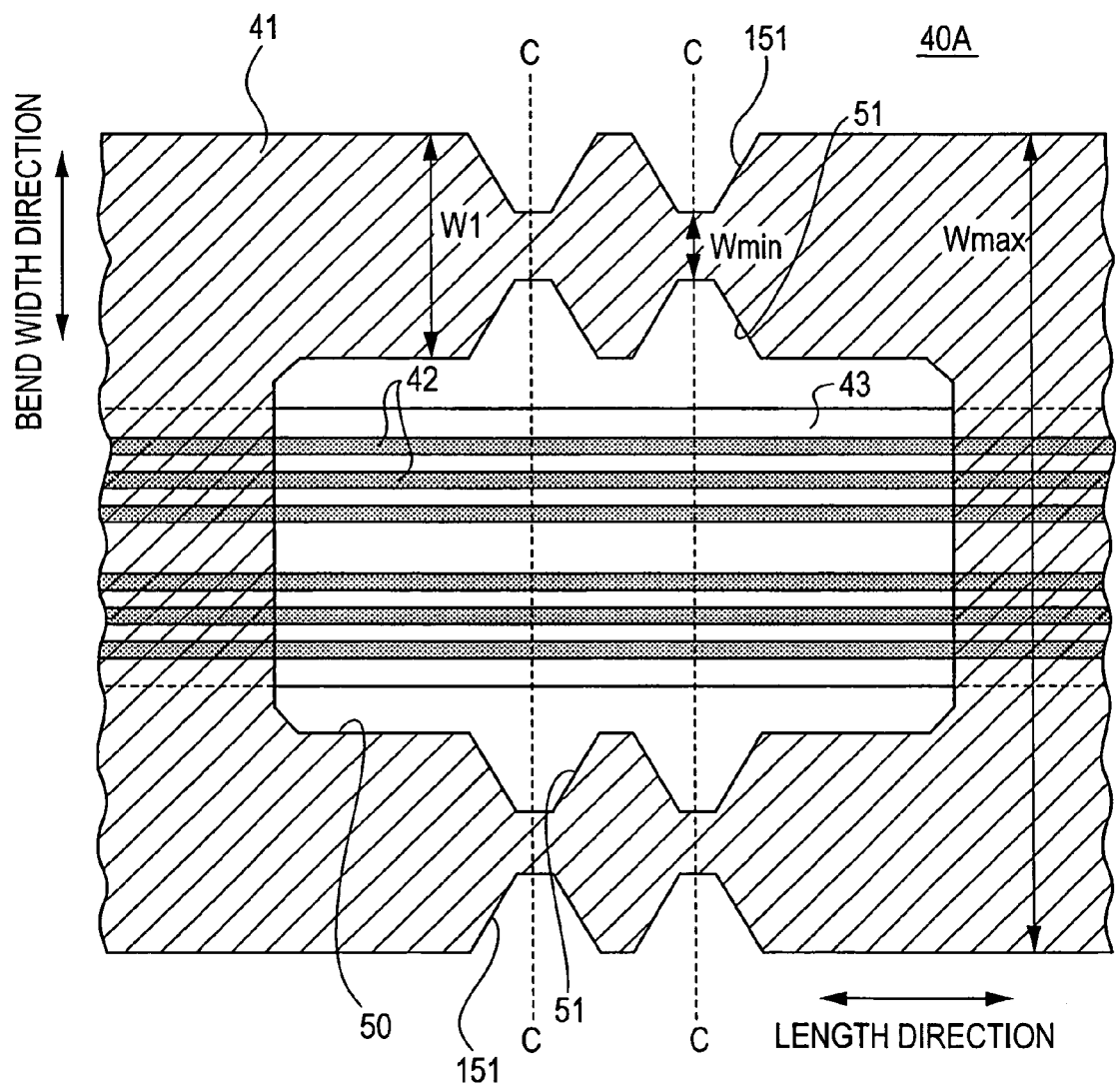
FIG. 6 is a plan view of notches according to a second preferred embodiment.

FIGS. 5 and 6 show modifications of the notches provided for the guide through hole 50. Referring to FIG. 5, according to a first modification, a plurality of notches 151 are formed separately from the guide through hole 50. The notches 151 are formed in a region outside the guide through hole 50 so as to reduce the remaining width of the base in the bend width direction. The notches 151 are V-shaped cutouts formed in the outer edges of the base 41 so as to point toward the guide through hole 50. Each of the notches 151 has a minimum width at the center thereof in the length direction of the base 41 (horizontal direction in FIG. 5), and has a symmetrical shape about the centerline (bending reference line C shown by a dashed line in FIG. 5).

Referring to FIG. 6, in a second modification, a plurality of notches 51 formed integrally with the guide through hole 50 (see FIG. 3) and a plurality of notches 151 formed separately from the guide through hole 50 (see FIG. 5) are both provided. In addition to the modifications shown in FIGS. 5 and 6, a plurality of notches may also be formed in regions between the guide through hole 50 and the outer edges of the base 41, or be formed as slits that extend along the bending reference lines C. Thus, the notches are not limited as long as they are formed as cutouts for locally reducing the remaining width of the base 41 in the bend width direction.

Although is the preferred embodiments are described above with reference to the accompanying drawings, various modifications are possible within the scope of the present invention and the present invention is not limited to the above-described embodiment.

What is claimed is:

1. A flexible wiring board for a magnetic head assembly, the flexible wiring board comprising:
a wiring pattern connected to a head body at one end and to a circuit system provided outside the magnetic head assembly at the other end, the head body being fixed to a free end of the magnetic head assembly;
an insulation protection film that protects the wiring pattern; and
a base composed of a metal that extends over the insulation protection film and the wiring pattern, the base having a guide through hole,
wherein the guide through hole has a plurality of notches disposed at different positions in a length direction of the base, and
wherein the notches are cutouts whose width is reduced in a direction from the inner periphery of the guide through hole toward the outer periphery of the base.

2. The flexible wiring board according to claim 1, wherein the base is bent.

3. The flexible wiring board according to claim 2, wherein, the guide through hole function as a guide for bending the base.

4. The flexible wiring board according to claim 2, wherein, the wiring pattern and the insulation protection film face inward.

5. The flexible wiring board according to claim 1, wherein the notches are cutouts whose width is reduced in a direction from the outer periphery of the base toward the inner periphery of the guide through hole.

6. The flexible wiring board according to claim 1, wherein the notches are cutouts whose width is reduced in a direction from the inner periphery of the guide through hole toward the outer periphery of the base and cutouts whose width is reduced in a direction from the outer periphery of the base toward the inner periphery of the guide through hole.

7. The flexible wiring board according to claim 1, wherein each of the notches is axisymmetric about a centerline of the notch in the length direction of the base.

8. The flexible wiring board according to claim 1, wherein the cutouts are formed in pairs such that the cutouts of each pair face each other in the bend width direction of the base.

9. The flexible wiring board according to claim 1, wherein the guide through hole extends beyond the outermost notches in the length direction of the base.

10. The flexible wiring board according to claim 1, wherein the base is composed of stainless steel.

11. The flexible wiring board according to claim 1, wherein the insulation protection film is composed of polyimide.

12. The flexible wiring board according to claim 1, wherein, the notches reduce a remaining width of the base in a bend width direction of the base.

* * * * *